United States Patent
Watanabe et al.

(10) Patent No.: US 7,362,788 B2
(45) Date of Patent: Apr. 22, 2008

(54) SEMICONDUCTOR LASER AND FABRICATING METHOD THEREOF

(75) Inventors: Masanori Watanabe, Nara (JP); Mitsuhiro Matsumoto, Kashihara (JP); Tadashi Takeoka, Mihara (JP); Fumie Kunimasa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 262 days.

(21) Appl. No.: 10/949,536

(22) Filed: Sep. 23, 2004

(65) Prior Publication Data

US 2005/0069004 A1    Mar. 31, 2005

(30) Foreign Application Priority Data

Sep. 26, 2003   (JP)   ............... 2003-335423

(51) Int. Cl.
*H01S 5/00*   (2006.01)
(52) U.S. Cl. ................. 372/46.01; 372/45.01
(58) Field of Classification Search .......... 372/75, 372/46.01, 43.01, 45.01, 39
See application file for complete search history.

(56) References Cited

U.S. PATENT DOCUMENTS

| 6,285,694 B1 * | 9/2001 | Shigihara ............ 372/45.01 |
| 6,606,334 B1 * | 8/2003 | Shigihara et al. ...... 372/45.01 |
| 2004/0151223 A1 | 8/2004 | Yoshida |

FOREIGN PATENT DOCUMENTS

| JP | 10-022561 | 1/1998 |
| JP | 11-233882 | 8/1999 |
| JP | 2001-210910 | 8/2001 |
| JP | 2002-026451 A | 1/2002 |
| JP | 2003-078204 | 3/2003 |
| JP | 2004-235382 A | 8/2004 |

OTHER PUBLICATIONS

Shigihara, K. et al. (Feb. 2002). "980-nm Semiconductor Laser for Exciting Erbium Doped Optical Fiber Amplifier," Mitsubishi Electronics Technologies Report, pp. 129-132 (Japanese language) and partial English translation of same, pp. 1-5.*

Grillot, P.N. et al. (Apr. 15, 2002). "Acceptor Diffusion and Segregation in $(Al_xGa_{1-x})_{0.5}In_{0.5}P$ Heterostructures," *Journal of Applied Physics* 91(8):4891-4899.

Shigihara, K. et al. (Feb. 2002). "980-nm Semiconductor Laser For Exciting Erbium Doped Optical Fiber Amplifier," *Mitsubishi Electronics Technologies Report*, pp. 129-132 (Japanese language) and partial English translation of same, pp. 1-5.

* cited by examiner

*Primary Examiner*—Minsun Oh Harvey
*Assistant Examiner*—Tuan N. Nguyen
(74) *Attorney, Agent, or Firm*—Morrison & Foerster LLP

(57) ABSTRACT

The present invention provides a semiconductor laser including a lower clad layer, an active layer including at least one quantum well layer, and an upper clad layer formed in this order above a semiconductor substrate, and having a window region including a portion in which the quantum well layer in the active layer and layers adjacent to the active layer are intermixed in the vicinity of a light emitting end face perpendicular to the surface of the semiconductor substrate, in which the lower clad layer has a refractive index higher than that of the upper clad layer, and the light intensity distribution in the window region spreads more widely in the direction perpendicular to the surface of the semiconductor substrate than the light intensity distribution in the gain region, and also provides a method for fabricating such a semiconductor laser.

11 Claims, 12 Drawing Sheets

SEMICONDUCTOR LASER AND FABRICATING METHOD THEREOF

This nonprovisional application is based on Japanese Patent Application No. 2003-335423 filed with the Japan Patent Office on Sep. 26, 2003, the entire contents of which are hereby incorporated by reference.

BACKGROUND OF THE INVENTION

1. Field of the Invention

The present invention relates to a semiconductor laser and a method for fabricating the same and, more particularly, to a semiconductor laser for use in reading/writing of data from/to an-optical disk (hereinafter, referred to as "for an optical disk") and a method for fabricating such a semiconductor laser.

2. Description of the Background Art

Conventionally, as a semiconductor laser for optical disks, an end face emitting-type semiconductor laser has been employed. Such an end face emitting-type semiconductor laser is required to operate at a high temperature of about 70° C. As a method for realizing this, a method is effective which increases the intensity of light confined within the active layer in the semiconductor laser to enhance interaction between the emitted laser light and electrons/holes.

However, if light is concentrated within the active layer in order to increase the intensity of light confined within the active layer, the emitted laser light tends to diverge in the direction perpendicular to the active layer. Therefore, with an end face emitting-type semiconductor laser which is generally utilized, the divergence of emitted laser light in the direction perpendicular to the active layer (hereinafter, referred to as "vertical radiation angle") becomes larger than the divergence in the direction horizontal to the active layer (hereinafter, referred to as "horizontal radiation angle"). For example, a far field pattern of emitted laser light has a vertical radiation angle of 24° and a horizontal radiation angle of 8°; therefore, the emitted laser light becomes an elliptical shape.

However, in using for optical disks, the laser light is required to have a complete round shape. Therefore, there has been employed a method which shapes elliptical laser light into a complete round shape by laser light shaping means or a method which removes a portion of the perimeter of elliptical laser light to form complete round laser light. However, the former method has had a problem that the introduction of laser light shaping means increases the cost of semiconductor lasers. Also, the latter method has had a problem that the efficiency of laser light utilization is reduced, preventing generation of high power laser light.

Further, there has been a problem that when the power of emitted laser light is increased for realizing high-speed data writing into optical disks, the light emitting end faces of the semiconductor laser are degraded. In order to suppress degradation of the light emitting end faces of a semiconductor laser, there has been employed a method which forms window regions at the light emitting end faces and in the vicinity thereof in the semiconductor laser.

Conventionally, the formation of window regions has been achieved by forming portions in which quantum well layers, guide layers and barrier layers constituting the active layer in the semiconductor laser are mixed-crystallized. By forming the window regions, the energy band gaps of the quantum well layers in the active layers within the window regions are increased and, therefore, light absorption in the quantum well layers is reduced, thereby reducing degradations of the light emitting end faces of the semiconductor laser.

Also, there is another method for forming window regions. FIG. 12A is a schematic perspective view of a conventional semiconductor laser described in Mitsubishi Electronics Technologies Report February 2002 (pp. 129-132). This conventional semiconductor laser includes an n-type $Al_xGa_{1-x}As$ ($x=x_{low}$) lower clad layer 2, an undoped AlGaAs guide layer 3, an undoped GaAs guide layer 4, an undoped InGaAs quantum well layer 5, an undoped GaAs barrier layer 6, an undoped InGaAs quantum well layer 7, an undoped GaAs guide layer 8, an undoped AlGaAs guide layer 9, a p-type $Al_xGa_{1-x}As$ upper clad layer ($x=x_{up}$) 10 and a p-type GaAs contact layer 11, that are sequentially deposited on an n-type GaAs substrate 1. Further, this conventional semiconductor laser has a ridge stripe portion 12 formed above n-type GaAs substrate 1, and window regions 13 formed at the light emitting end faces and in the vicinity thereof for suppressing degradations of the light emitting end faces of the semiconductor laser.

As shown in the refractive index distribution in FIG. 12B, in order to reduce the elliptical ratio (vertical radiation angle/horizontal radiation angle) of emitted laser light and, simultaneously, raise the kink level, the refractive index $n_c^l$ of n-type AlGaAs lower clad layer 2 is set to a value higher than the refractive index $n_c^u$ of p-type AlGaAs upper clad layer 10. Therefore, the Al composition ratios of these layers become $x_{low}<x_{up}$.

With such a configuration, the light intensity distribution spreads toward the substrate and, therefore, becomes less influenced by the refractive index of ridge stripe portion 12, which raises the kink level. Further, since the light intensity distribution spreads toward the substrate, the elliptical ratio of emitted laser light may be reduced. Namely, when $x_{low}=x_{up}$ holds, emitted laser light has a vertical radiation angle of 31.5°, a horizontal radiation angle of 8.6° and an elliptical ratio of 3.7. On the other hand, when $n_c^l-n_c^u=0.029$ holds, emitted laser light has a vertical radiation angle of 23.9°, a horizontal radiation angle of 10.1° and an elliptical ratio of 2.4 (see, for example, a graph shown in pp. 130 of Mitsubishi Electronics Technologies Report February 2002).

In the case laser light shaping means is not used, as a semiconductor laser for optical disks, a semiconductor laser capable of emitting laser light with a lower elliptical ratio must be used.

However, the conventional semiconductor laser described in Mitsubishi Electronics Technologies Report February 2002 (pp. 129-132) emits laser light with an elliptical ratio of 2.4. Therefore, in the case laser light shaping means is not used, this conventional semiconductor laser has been insufficient for utilization for optical disks.

Furthermore, there has been a problem that when the elliptical ratio of laser light emitted from this conventional semiconductor laser is reduced, the ratio of light confined within the active layer -is decreased and, consequently, the threshold current is raised and the characteristic temperature (a parameter representing the ratio of increase of the threshold current relative to temperature increase) is lowered, which prevents this conventional semiconductor laser from operating at a high temperature of about 70° C.

SUMMARY OF THE INVENTION

It is an object of the present invention to provide a semiconductor laser capable of emitting laser light with a low elliptical ratio even in high temperature operation environments, and a method for fabricating such a semiconductor laser.

The present invention provides a semiconductor laser including a lower clad layer, an active layer including at least one quantum well layer, and an upper clad layer formed in this order above a semiconductor substrate, and having a window region including a portion in which the quantum well layer in the active layer and layers adjacent to the active layer are mixed-crystallized in the vicinity of a light emitting end face perpendicular to the surface of the semiconductor substrate, wherein the lower clad layer has a refractive index higher than that of the upper clad layer, and the light intensity distribution in the window region spreads more widely in the direction perpendicular to the surface of the semiconductor substrate than the light intensity distribution in the gain region. With such a configuration, the lower clad layer has a refractive index higher than that of the upper clad layer, and therefore the light intensity distribution in the gain region spreads toward the semiconductor substrate and the light intensity distribution further spreads in the window region, without changing the ratio of light confined within the active layer. This may realize further reduction in the elliptical ratio of emitted laser light, without degrading the threshold current and the characteristic temperature.

In the present application, "an active layer including at least one quantum well layer" means an active layer consisting of at least one quantum well layer and other layers, as well as an active layer consisting of only at least one quantum well layer.

The present invention also provides a semiconductor laser including a lower clad layer, an active layer including at least one quantum well layer, and an upper clad layer formed in this order above a semiconductor substrate, and having a window region including a portion in which the quantum well layer in the active layer and layers adjacent to the active layer are mixed-crystallized in the vicinity of a light emitting end face perpendicular to the surface of the semiconductor substrate, wherein the lower clad layer includes a layer having a refractive index higher than that of the upper clad layer, and the light intensity distribution in the window region spreads more widely in the direction perpendicular to the surface of the semiconductor substrate than the light intensity distribution in the gain region. With such a configuration, similarly, the lower clad layer has a refractive index higher than that of the upper clad layer, and therefore the light intensity distribution in the gain region spreads toward the semiconductor substrate and the light intensity distribution further spreads in the window region, without changing the ratio of light confined within in the active layer. This may realize further reduction in the elliptical ratio of emitted laser light, without degrading the threshold current and the characteristic temperature.

In the semiconductor laser according to the present invention, preferably, the lower clad layer includes a first lower clad layer closer to the semiconductor substrate and a second lower clad layer closer to the active layer, and the first lower clad layer has a refractive index higher than that of the second lower clad layer. With such a configuration, the threshold current may be lowered without changing the ratio of light confined within the active layer, and also the light intensity distribution spreads toward the semiconductor substrate, which realizes emission of laser light with a reduced vertical radiation angle and, therefore, a reduced elliptical ratio.

In the semiconductor laser according to the present invention, preferably, the first lower clad layer has a refractive index higher than that of the second lower clad layer by 0.003 or more to 0.02 or less. If the refractive index difference between the layers is greater than 0.02, the semiconductor laser tends to become difficult to operate in high temperature environments at about 70° C. If the refractive index difference between the layers is less than 0.003, the vertical radiation angle of emitted laser light tends not to be reduced. When the refractive index difference between the layers is 0.003 or more to 0.02 or less, it becomes possible to realize a semiconductor laser which emits laser light with a low elliptical ratio and has a low threshold current and a high characteristic temperature (threshold current variations due to temperature increase are small).

In the semiconductor laser according to the present invention, preferably, the second lower clad layer has a thickness of 0.05 µm or more to 0.9 µm or less. When the second lower clad layer has a thickness of 0.05 µm or more to 0.9 µm or less, the effect of the lower clad layer consisting of two layers may be easily achieved, and therefore it tends to be possible to realize a semiconductor laser which emits laser light with a low elliptical ratio and is suitable for use with optical disks.

In the semiconductor laser according to the present invention, preferably, the window region, a transition region where the spread of the light intensity distribution varies and the gain region are arranged in this order from the light emitting end face, and the photoluminescence (PL) wavelength in the active layer within the window region is shorter than the PL wavelength in the active layer within the gain region by 15 nm or more. When the PL wavelength in the active layer in the window region is shorter than the PL wavelength in the active layer in the gain region by 15 nm or more, the spread of light intensity distribution in the vertical direction in the window region tends to be increased, reducing the elliptical ratio of emitted laser light.

In the semiconductor laser according to the present invention, preferably, the window region, a transition region where the spread of the light intensity distribution varies and the gain region are arranged in this order from the light emitting end face, and the PL wavelength in the active layer within the window region is shorter than the PL wavelength in the active layer within the gain region by 40 nm or more. When the PL wavelength in the active layer in the window region is shorter than the PL wavelength in the active layer in the gain region by 40 nm or more, the variation of the vertical radiation angle of emitted laser light with respect to the variation of the PL wavelength difference between these active layers within these regions becomes small, and therefore it becomes possible to realize a semiconductor laser which emits laser light with a low elliptical ratio and small variation in the vertical radiation angle.

In the semiconductor laser according to the present invention, preferably, the window region, a transition region where the spread of the light intensity distribution varies and the gain region are arranged in this order from the light emitting end face, and the transition region has a width of 16 µm or more in the direction perpendicular to the light emitting end face. When the width of the transition region is 16 µm or more, the light intensity distribution gradually spreads in the transition region, reducing the light loss.

Preferably, the semiconductor laser according to the present invention further includes a cap layer having a valence band energy higher than that of the upper clad layer, above the upper clad layer, wherein the mixed crystallization is achieved by injecting impurity from a portion above the cap layer and causing the impurity to diffuse. In the case of using the window region forming method which is generally called IILD (Impurity Induced Layer Disordering), impurity diffuses widely within the cap layer, and therefore the transition region where the spread of light intensity distribution varies may be easily formed.

In the semiconductor laser according to the present invention, preferably, the lower clad layer, the active layer and the upper clad layer are formed from semiconductor layers represented by the general formula: $(Al_xGa_{1-x})_yIn_{1-y}P$ (where $0 \leq x \leq 1$ and $0 \leq y \leq 1$) or $Ga_zIn_{1-z}P$ (where $0 \leq z \leq 1$). When the lower clad layer, the active layer and the upper clad layer are formed from these materials, the formation of the window region by the IILD may be successfully achieved.

In the semiconductor laser according to the present invention, preferably, the lower clad layer, the active layer and the upper clad layer are formed from semiconductor layers represented by the general formula: $Al_rGa_{1-r}As$ (where $0 \leq r \leq 1$) or GaAs. When the lower clad layer, the active layer and the upper clad layer are formed from these materials, the formation of the window region by the IILD may be successfully achieved.

The present invention also provides a method for fabricating a semiconductor laser including a lower clad layer, an active layer including at least one quantum well layer, and an upper clad layer formed in this order above a semiconductor substrate, in which the lower clad layer has a refractive index higher than that of the upper clad layer. The method includes the steps of: forming a cap layer having a valence band energy higher than that of the upper clad layer, above the upper clad layer; and injecting impurity from a portion above the cap layer to form a portion in which the quantum well layer in the active layer and layers adjacent to the active layer are mixed-crystallized, in the vicinity of a light emitting end face perpendicular to the surface of the semiconductor substrate. With such a method, it becomes possible to easily fabricate a semiconductor laser having a transition region for gradually spreading the light intensity distribution in the direction perpendicular to the semiconductor substrate surface.

The present invention also provides a method for fabricating a semiconductor laser including a lower clad layer, an active layer including at least one quantum well layer, and an upper clad layer formed in this order above a semiconductor substrate, in which the lower clad layer includes a layer having a refractive index higher than that of the upper clad layer. The method includes the steps of: forming a cap layer having a valence band energy higher than that of the upper clad layer, above the upper clad layer; and injecting impurity from a portion above the cap layer to form a portion in which the quantum well layer in the active layer and layers adjacent to the active layer are mixed-crystallized, in the vicinity of a light emitting end face perpendicular to the surface of the semiconductor substrate. With such a method, it becomes possible to easily fabricate a semiconductor laser having a transition region for gradually spreading the light intensity distribution in the direction perpendicular to the semiconductor substrate surface.

In the semiconductor laser fabricating method according to the present invention, preferably, the upper clad layer contains beryllium (Be). Since Be is a p-type dopant less prone to diff-use, even when the upper clad layer is heated during the formation of the window region, Be will be less prone to diff-use from the upper clad layer into other layers.

In the semiconductor laser fabricating method according to the present invention, preferably, the upper clad layer is deposited by a molecular beam epitaxy (MBE) method. In the case of using Be as p-type dopant, in order to utilize a metal-organic chemical vapor deposition (MOCVD) method for depositing the upper clad layer, a hazardous organic compound of Be must be used. However, in the case the MBE method is utilized for depositing the upper clad layer, Be element may be heated and evaporated, which enables relatively safe utilization of Be.

In the semiconductor laser fabricating method according to the present invention, preferably, the upper clad layer contains magnesium (Mg) or zinc (Zn). Since Mg is a p-type dopant less prone to diffuse, even when the upper clad layer is heated during the formation of the window region, Mg will be less prone to diffuse from the upper clad layer into other layers. Zn is a dopant easy to treat in the MOCVD method, and by restricting the process temperature of window region formation, etc., a semiconductor laser having a favorable property may be easily fabricated.

According to the present invention, it is possible to provide a semiconductor laser capable of emitting laser light with a low elliptical ratio even in high temperature operation environments, and a method for fabricating such a semiconductor laser.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
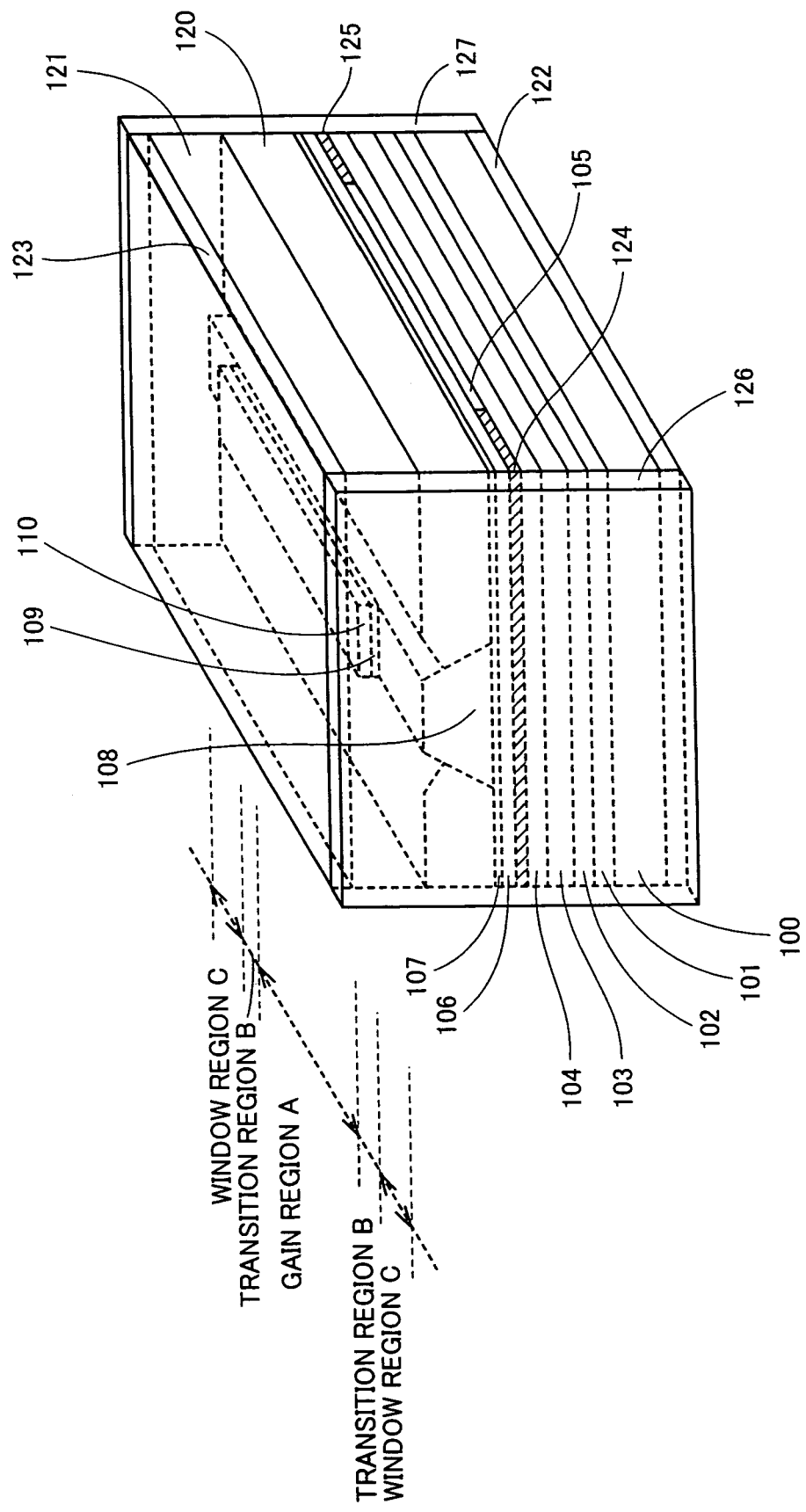
FIG. 1 is a schematic perspective view of a semiconductor laser according to a preferable embodiment of the present invention.

Hereinafter, embodiments of the present invention will be described. In the drawings of the present specification, the same reference characters will denote the same or corresponding portions. Furthermore, in the present specification, $(Al_xGa_{1-x})_yIn_{1-y}P$ (where $0 \leq x \leq 1$, $0 \leq y \leq 1$), $Ga_zIn_{1-z}P$ (where $0 \leq z \leq 1$) and $Al_rGa_{1-r}As$ (where $0 \leq r \leq 1$) will be abbreviated as AlGaInP, GaInP and AlGaAs, respectively.

First Embodiment

FIG. 1 is a schematic perspective view of a semiconductor laser according to a preferable embodiment of the present invention. As shown in FIG. 1, the semiconductor laser of the present invention includes an n-type GaAs buffer layer 101, an n-type GaInP buffer layer 102, an n-type $(Al_{0.65}Ga_{0.35})_{0.5}In_{0.5}P$ first lower clad layer 103 (thickness: 2.0 μm), an n-type $(Al_{0.665}Ga_{0.335})_{0.5}In_{0.5}P$ second lower clad layer 104 (thickness: 0.2 μm), an undoped-active layer 105 including quantum well layers, a p-type $(Al_{0.68}Ga_{0.32})_{0.5}In_{0.5}P$ first upper clad layer 106 (thickness: 0.1 μm), and a p-type GaInP etching stop layer 107, which are sequentially formed on an n-type GaAs substrate 100.

Furthermore, as a ridge stripe portion, there is formed a p-type $(Al_{0.68}Ga_{0.32})_{0.5}In_{0.5}P$ second upper clad layer 108 (thickness: 1.5 μm) protruded upwardly from a portion of the surface of p-type etching stop layer 107. A p-type GaInP intermediate band gap layer 109 (thickness: 0.05 μm) and a p-type GaAs cap layer 110 (thickness: 0.5 μm) are sequentially formed on p-type second upper clad layer 108.

Furthermore, on the region of p-type GaInP etching stop layer 107 on which p-type second upper clad layer 108 is not formed, an n-type AlInP current stop layer 120 is formed. A p-type GaAs contact layer 121 and a p-side electrode 123 are sequentially formed on n-type current stop layer 120. Furthermore, on the surface of n-type substrate 100 opposite to the side onto which the aforementioned semiconductor layers are deposited, an n-side electrode 122 is formed.

Furthermore, a front face reflective film 126 and a rear face reflective film 127 are respectively formed at light emitting end faces 124, 125 perpendicular to the surface of n-type substrate 100.

Here, active layer 105 is formed by depositing the following layers in order of mention from n-type second lower clad layer 104 side: a $(Al_{0.56}Ga_{0.44})_{0.5}In_{0.5}P$ guide layer with a thickness of 50 nm; a $Ga_{0.5}In_{0.5}P$ quantum well layer with a thickness of 5 nm; a $(Al_{0.56}Ga_{0.44})_{0.5}In_{0.5}P$ barrier layer with a thickness of 5 nm; a $Ga_{0.5}In_{0.5}P$ quantum well layer with a thickness of 5 nm; a $(Al_{0.56}Ga_{0.44})_{0.5}In_{0.5}P$ barrier layer with a thickness of 5 nm; a $Ga_{0.5}In_{0.5}P$ quantum well layer with a thickness of 5 nm; and a $(Al_{0.56}Ga_{0.44})_{0.5}In_{0.5}P$ guide layer with a thickness of 50 nm.

N-side electrode 122 is formed by depositing an AuGe layer, a Ni layer, a Mo layer and an Au layer in this order on n-type substrate 100. P-side electrode 123 is formed by depositing an AuZn layer, a Mo layer and an Au layer in this order on p-type contact layer 121.

Front face reflective film 126 (reflectivity: 8%) on light emitting end face 124 is formed from an $Al_2O_3$ layer and rear face reflective film 127 (reflectivity: 90%) on light emitting end face 125 is formed by depositing an $Al_2O_3$ layer, a Si layer, an $Al_2O_3$ layer, a Si layer and an $Al_2O_3$ layer in this order from light emitting end face 125. The semiconductor laser has a resonator length of 900 μm.

The aforementioned semiconductor layers are formed by a MBE method, wherein the n-type dopant is Si and the p-type dopant is Be.

In this semiconductor laser, the regions (window regions C) extending over a constant width from light emitting end faces 124, 125 are partially mixed-crystallized, and the active layers within window regions C have a energy band gap greater than that of the active layer within a gain region A. Therefore, light in the semiconductor laser will be less easily absorbed in window regions C, which may prevent degradations of light emitting end faces 124, 125 of the semiconductor laser. Here, gain region A refers to a region where light is amplified.

Window regions C are formed by sequentially depositing, on semiconductor substrate 100, the respective layers from n-type GaAs buffer layer 101 to p-type GaAs cap layer 110 over the entire surface of semiconductor substrate 100, then forming sequentially a ZnO film (not shown) with a thickness of 35 nm and a $SiO_2$ film (not shown) with a thickness of 200 nm on the both end portions of the upper surface of P-type GaAs cap layer 110, and thermally processing the ZnO film at 510° C. for two hours to diffuse Zn. Transition regions B are also formed during the formation of window regions C. Transition regions B refer to regions where the spread of light intensity distribution varies. The $SiO_2$ film is formed for preventing Zn from evaporating to the outside. The ZnO and $SiO_2$ films are removed after the thermal process. As shown in FIG. 1, the opposite end portions (the portions extending by about 30 μm from the light emitting end faces) of p-type GaInP intermediate band gap layer 109 and p-type GaAs cap layer 110 are removed.

Figure 12A:
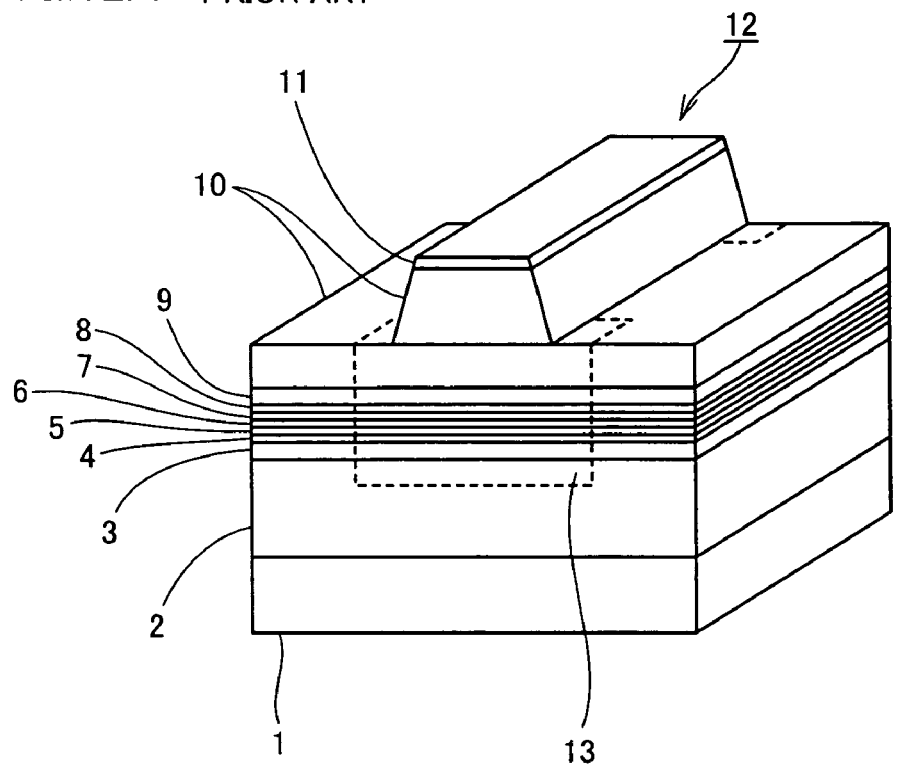
FIG. 12A is a schematic perspective view of a conventional semiconductor laser.
Figure 12B:
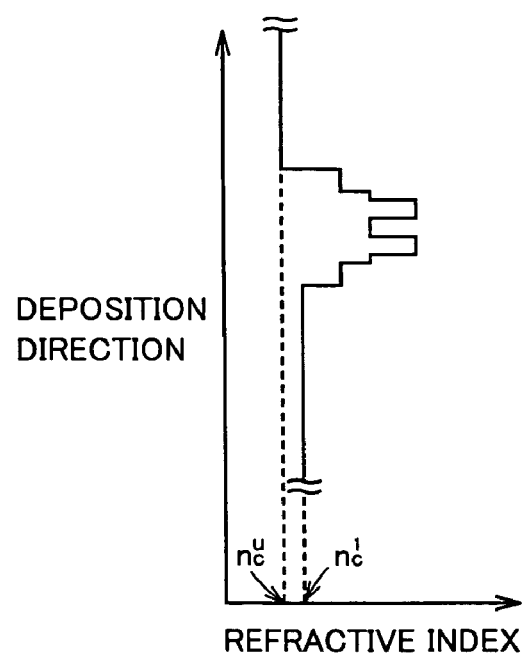
FIG. 12B shows the refractive index distribution in the semiconductor laser shown in FIG. 12A.

N-type first lower clad layer 103 and n-type second lower clad layer 104 in the n-type substrate 100 side in the semiconductor laser have Al contents lower than those of p-type first upper clad layer 106 and p-type second upper clad layer 108 which are not in the n-type substrate 100 side. Therefore, n-type first lower clad layer 103 and n-type second lower clad layer 104 have refractive indexes greater than those of p-type first upper clad layer 106 and p-type second upper clad layer 108. Consequently, in gain region A in the semiconductor laser, the light intensity distribution spreads toward n-type substrate 100, like the conventional semiconductor laser shown in FIG. 12A.

Figure 2:
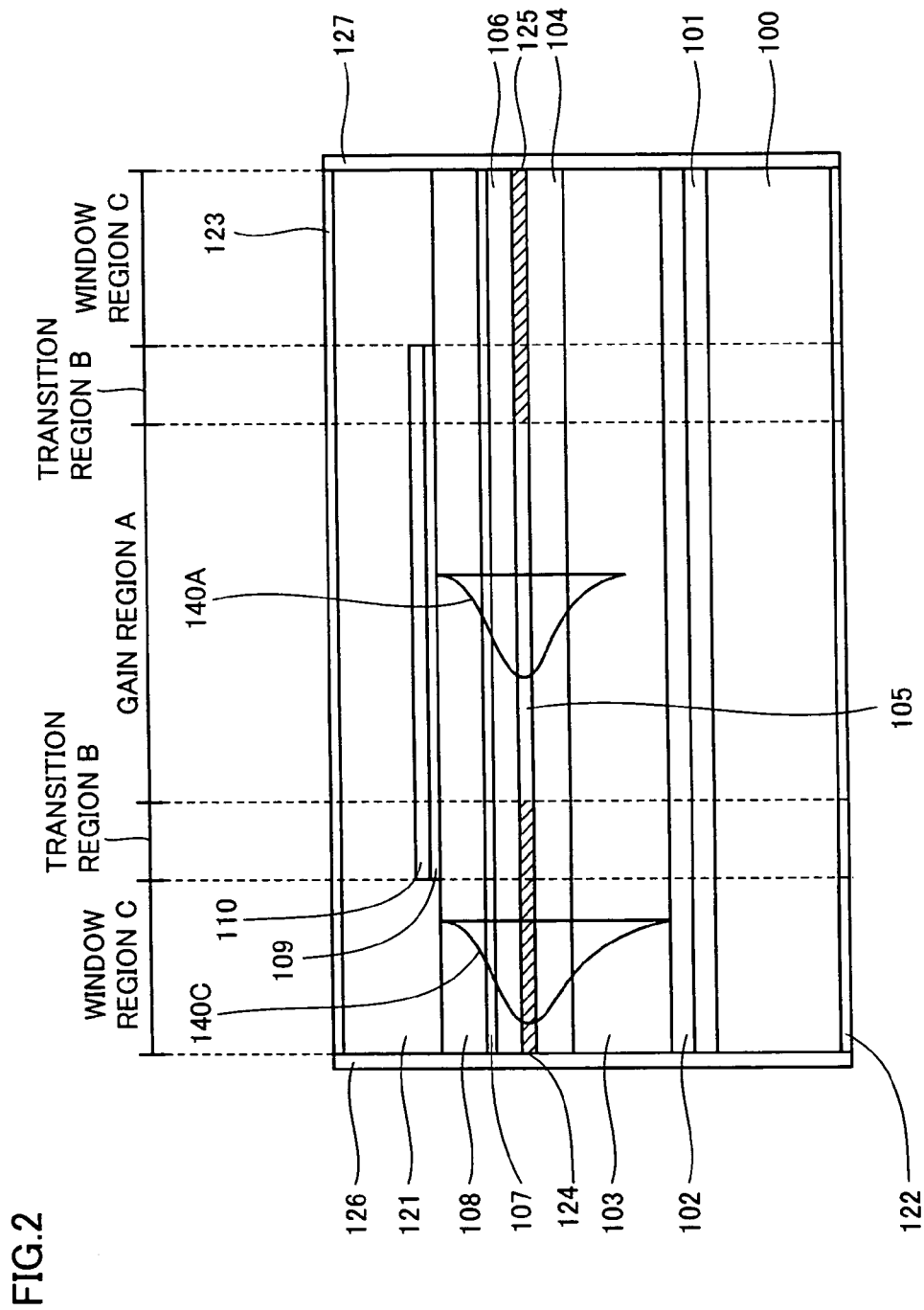
FIG. 2 is a schematic cross sectional view along the direction of a ridge stripe of the semiconductor laser shown in FIG. 1.

Further, in the semiconductor laser according to the present invention, as shown in the schematic cross sectional view of FIG. 2, the light intensity distribution 140A in gain region A in the semiconductor laser further spreads toward n-type substrate 100 in the direction perpendicular to the surface of n-type substrate 100 in window regions C (light intensity distribution 140C).

Figure 3:
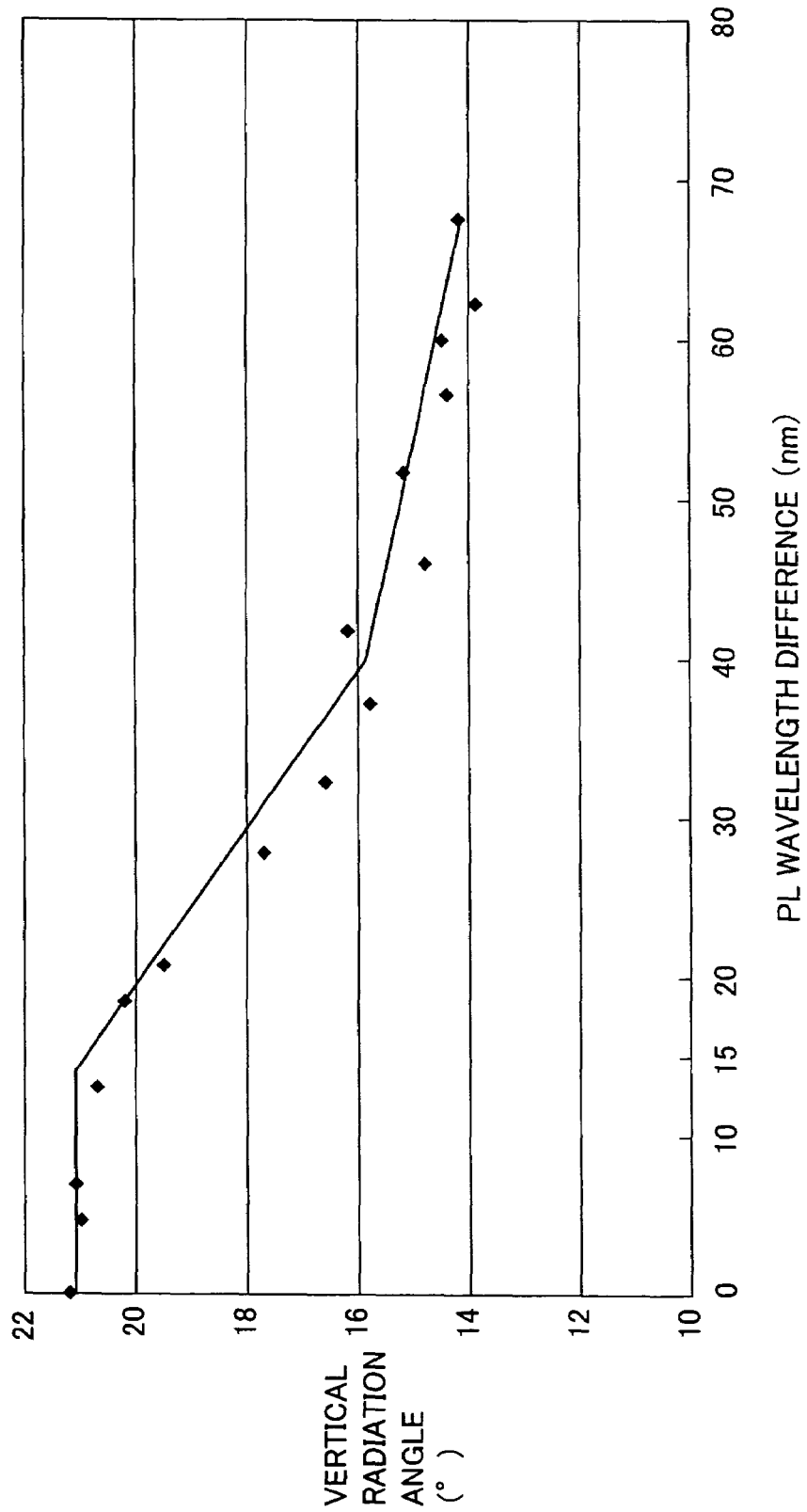
FIG. 3 shows the relation between a vertical radiation angle of emitted laser light and a PL wavelength difference between a PL wavelength in an active layer in a gain region of the semiconductor laser and a PL wavelength of active layers in window regions of the semiconductor laser according to the present invention.

This occurs for the reason which will be described below. FIG. 3 shows the relation between the vertical radiation angle of emitted laser light and the PL wavelength difference between the PL wavelength in the active layer in the gain region of the semiconductor laser and the PL wavelength of the active layers in the window regions. This was obtained from semiconductor lasers which were formed to have active layers in the window regions having different PL wavelengths by forming the window regions under different conditions. As can be seen from FIG. 3, where the PL wavelength difference is 15 nm or more (where the PL wavelength of the active layers in the window regions is shorter than the PL wavelength of the active layer in the gain region by 15 nm or more), the vertical radiation angle of emitted laser light certainly decreases with increasing PL wavelength difference. Further, where the PL wavelength difference is 40 nm or more (where the PL wavelength of the active layers in the window regions is shorter than the PL wavelength of the active layer in the gain region by 40 nm or more), the vertical radiation angle of emitted laser light becomes less than 16°, and also the vertical radiation angle of emitted laser light varies by a reduced amount with PL wavelength difference, resulting in reduced variations of the vertical radiation angle due to variations of the PL wavelength difference.

Figure 4A:
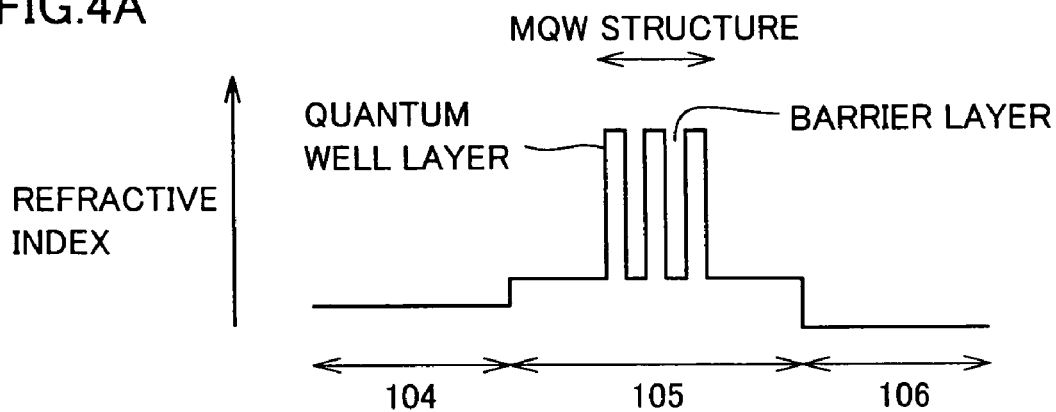
FIG. 4A shows refractive index distribution in the semiconductor laser in the case window regions is not formed.
Figure 4B:
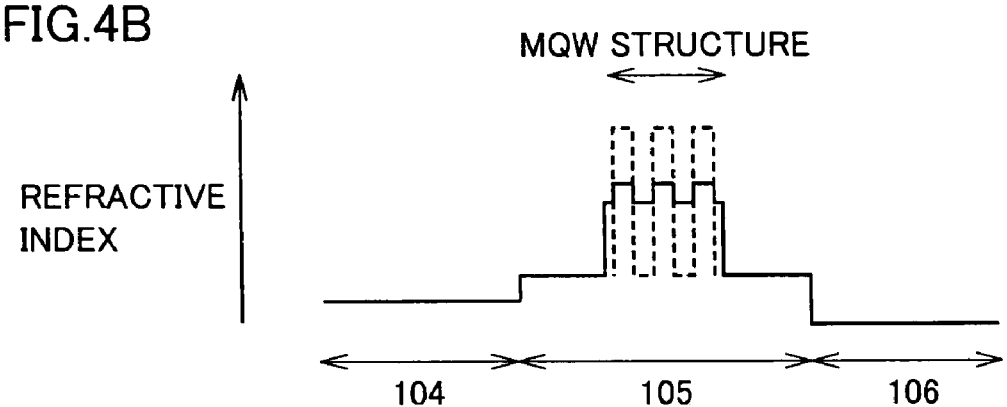
FIG. 4B shows refractive index distribution in the semiconductor laser of the present invention in the case only the quantum well layers and the barrier layers are mixed-crystallized.
Figure 4C:
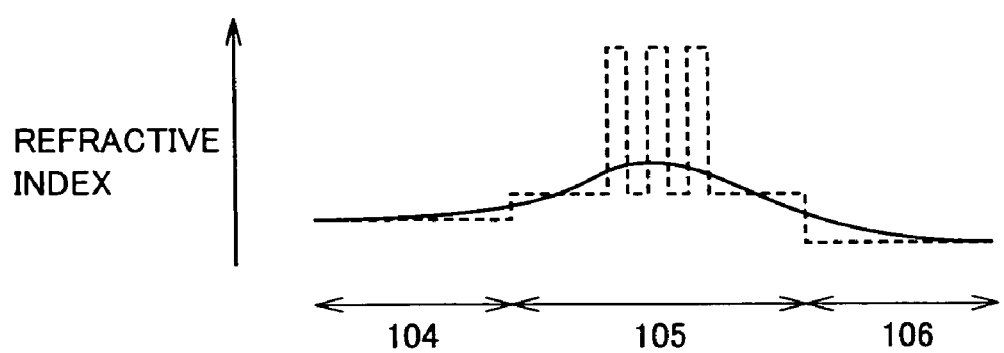
FIG. 4C shows the variation of the average refractive index of the MQW configuration in the case quantum well layers, an n-type second lower clad layer and a p-type first upper clad layer adjacent to the active layer are mixed-crystallized.

FIGS. 4A to 4C schematically show the refractive index distribution in the active layers in the window regions formed under varying formation conditions. FIG. 4A shows a refractive index distribution in the case window regions is not formed. FIG. 4B shows a refractive index distribution in the case only the quantum well layers and the barrier layers in active layer 105 are mixed-crystallized. In this case, the average refractive index in the multiple quantum well (MQW) configuration consisting of the quantum well layers and the barrier layers in active layer 105 is not changed, and therefore the vertical radiation angle of the emitted laser light is not changed. Therefore, this case is deemed to correspond to the case where the PL wavelength difference is less than 15 nm in FIG. 3. However, as shown in FIG. 4C, the quantum well layers, n-type second lower clad layer 104 and p-type first upper clad layer 106 adjacent to active layer 105 are mixed-crystallized, the average refractive index in the MQW configuration is changed, and, therefore the vertical radiation angle of emitted laser light is changed. Consequently, this case is deemed to correspond to the case where the PL wavelength difference of the window regions shown in FIG. 3 is 15 nm or more.

Figure 5A:
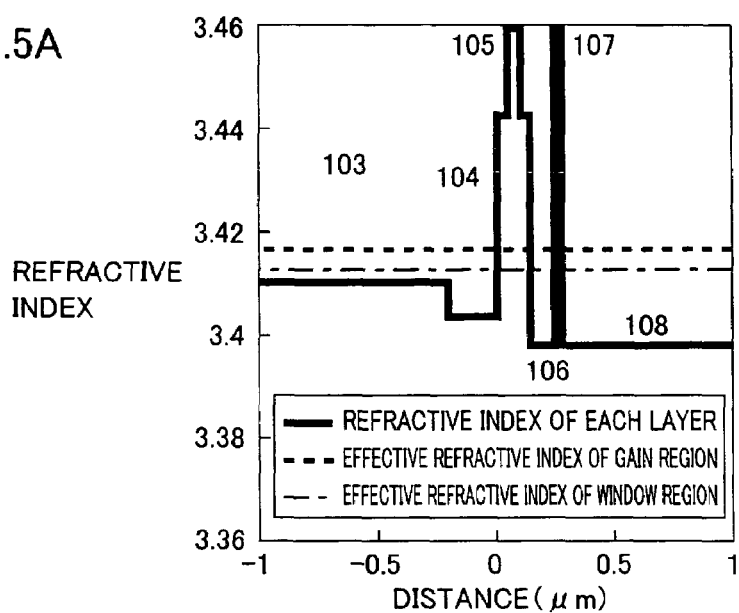
FIG. 5A is a schematic diagram for describing that the light intensity distribution further spreads in the window regions in the semiconductor laser according to the present invention.

FIG. 5A is a diagram for describing that the light intensity distribution spreads in the window regions in the semiconductor laser according to the present invention. The horizontal axis represents the thick-wise distance with the center of the thickness of active layer 105 being 0 μm (distances towards the semiconductor substrate are represented by negative values), and the vertical axis represents the refractive index. Here, attention is directed to the relation between the refractive index of n-type first lower clad layer 103 and the effective refractive indexes of the active layers in the window regions and in the gain region.

Here, the spread of the light intensity distribution in a clad layer is directly proportional to the value of exp [−γ|x|] (where x is the distance from the center of MGW), and the value which is an indicator of the spread is 1/γ (namely, the larger the value of 1/γ, the more widely the light intensity distribution spreads). Further, the following equation holds: $\gamma^2=(N_{eff}^2-n^2)\ k_0^2$ (wherein $N_{eff}$ is the effective refractive index of the active layer, n is the refractive index of each clad layer, $k_0$ is $2\pi/\lambda$, and $\lambda$ is the light wavelength).

1/γ of n-type first lower clad layer 103 within the gain region is 0.488 μm, and 1/γ of n-type first lower clad layer 103 within the window regions is 0.827 μm. This is because the effective refractive index of the active layers in the window regions becomes closer to the refractive index of n-type first lower clad layer 103, and therefore the value of $(N_{eff}^2-n^2)$ in the equation, $\gamma^2=(N_{eff}^2-n^2)\ k^2$, becomes smaller and the value of γ also becomes smaller.

Figure 5B:
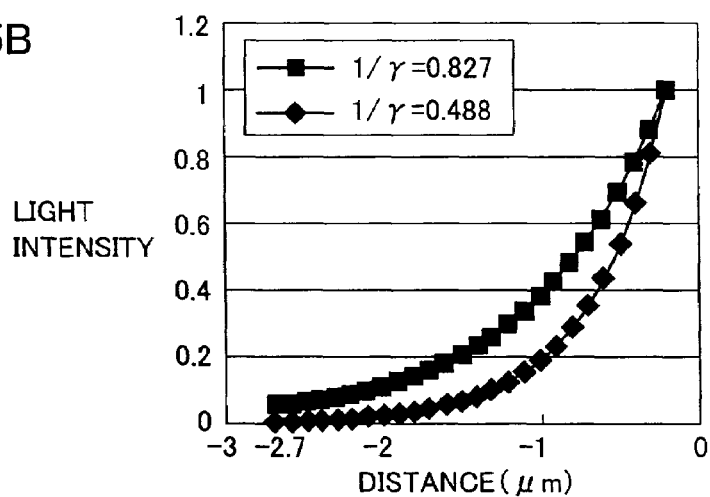
FIG. 5B is a diagram showing that the light intensity distribution spreads due to the variation of the value of $1/\gamma$ in the semiconductor laser according to the present invention.

FIG. 5B shows that the light intensity distribution spreads due to the variation of 1/γ in n-type first lower clad layer 103. The horizontal axis represents the thick-wise distance with the center of the thickness of active layer 105 being 0 μm (distances towards the semiconductor substrate are represented by negative values), and the vertical axis represents the light intensity (which is the relative value with the light intensity at the interface between n-type first lower clad layer 103 and n-type second lower clad layer 104 being 1). As shown in FIG. 5B, while in the case of 1/γ of 0.488 μm, the light intensity becomes 0 at a distance of about 2.7 μm from the center of the thickness of active layer 105 toward the semiconductor substrate, in the case of 1/γ of 0.827 μm, the light intensity does not becomes 0 at a distance of about 2.7 μm from the center of the thickness of active layer 105 toward the semiconductor substrate. This result reveals that, with the present embodiment, the light intensity distribution in the window regions spreads more widely than that in the gain region in the direction perpendicular to the semiconductor substrate surface.

Also, while 1/γ of p-type second upper clad layer 108 in the gain region is 0.295 μm, 1/γ of p-type second upper clad layer 108 in the window regions is 0.338 μm. Therefore, the light intensity distribution spreads in p-type second upper clad layer 108 within the window regions, but does not spread more widely than the light intensity distribution in n-type first lower clad layer 103 in the window regions.

Figure 5C:
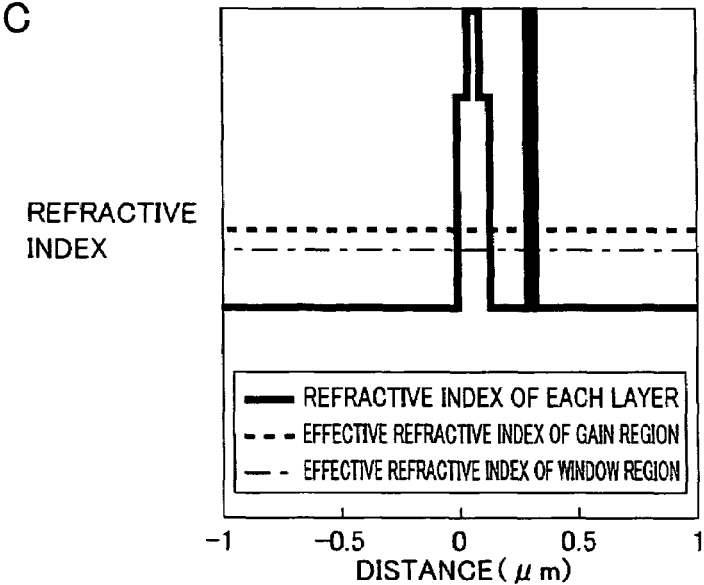
FIG. 5C is a schematic diagram showing the relation between the refractive index of the clad layers and the effective refractive indexes of the active layers in the window regions and the gain region, in the case both the n-type and p-type clad layers adjacent to the active layer have a low refractive index.

FIG. 5C shows the relation between the refractive index and the effective refractive indexes of the active layers in the window regions and the gain region, in the case both the n-type and p-type clad layers adjacent to the active layer have a low refractive index. In this case, even if the effective refractive index of the active layers within the window regions is lowered, this effective refractive index will not significantly approach the refractive index of these clad layers since these clad layers also have a low refractive index. Therefore, the value of $(N_{eff}^2-n^2)$ in the equation, $\gamma^2=(N_{eff}^2-n^2)k_0^2$, will not become small. Accordingly, in this case, the light intensity distribution in the window regions will not spread widely.

In the case the n-type and p-type clad layers have different refractive indexes, when the effective refractive index of the active layers within the window regions is lowered, the spread of the light intensity distribution further increases in the clad layer having a higher refractive index. In the present embodiment, the n-type clad layer is configured to consist of two layers having different refractive indexes, and n-type second lower clad layer 104 closer to active layer 105 has a refractive index lower than that of n-type first lower clad layer 103 closer to semiconductor substrate 100. Also, while a single n-type clad layer may be employed in the present embodiment, the n-type clad layer configured to consist of two layers having different refractive indexes is preferable since the vertical radiation angle of emitted laser light may be more largely reduced.

Figure 6A:
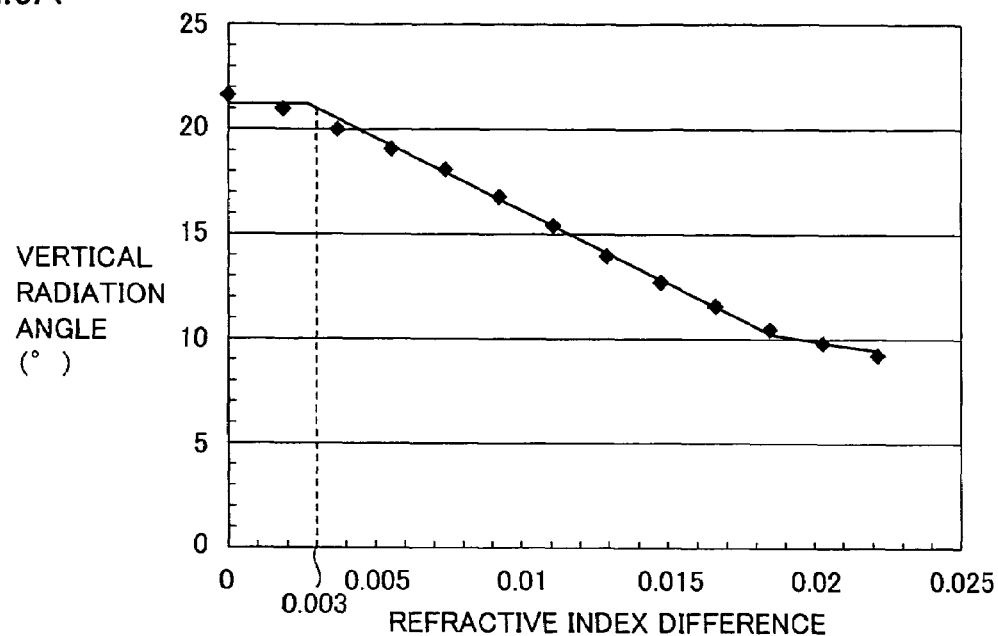
FIG. 6A shows the relation between the vertical radiation angle of emitted laser light and the refractive index difference between the n-type first lower clad layer and the n-type second lower clad layer.
Figure 6B:
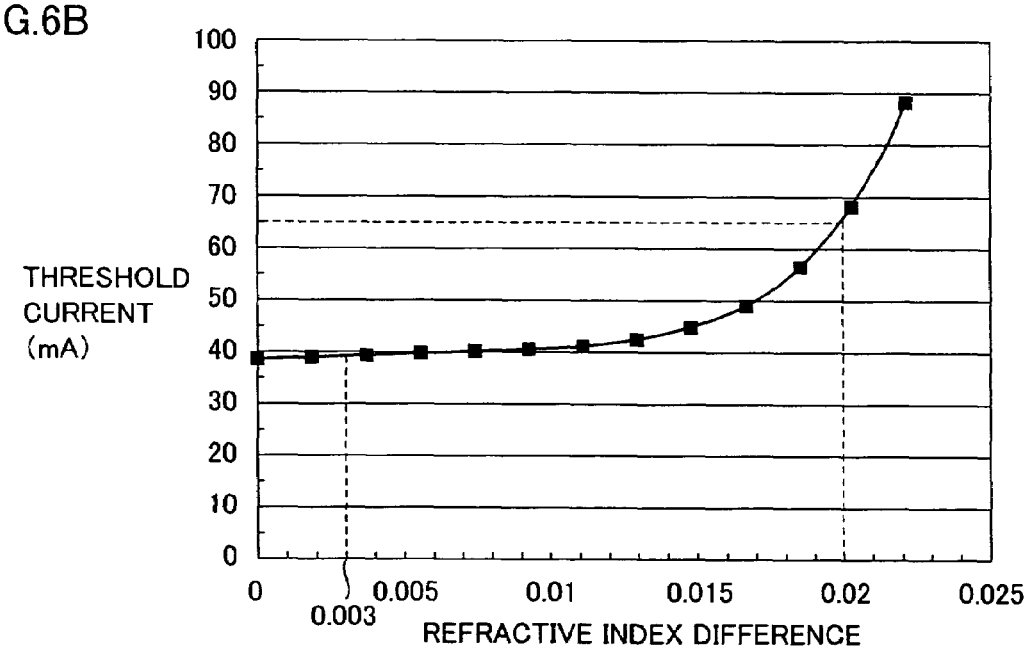
FIG. 6B shows the relation between the threshold current and the refractive index difference between the n-type first lower clad layer and the n-type second lower clad layer.

FIG. 6A shows the relation between the vertical radiation angle of emitted laser light and the refractive index difference between n-type first lower clad layer 103 and n-type second lower clad layer 104. FIG. 6B shows the relation between the threshold current and the refractive index difference between n-type first lower clad layer 103 and n-type second lower clad layer 104. When the refractive index difference is increased to a value of 0.003 or more, the vertical radiation angle of emitted laser light decreases as shown in FIG. 6A,.but the threshold current increases as shown in FIG. 6B. In order to decrease the vertical radiation angle of emitted laser light, it is desirable that the refractive index difference between these layers is 0.003 or more, as can be seen from the relation shown in FIG. 6A. Also, in order to set the threshold current to a value of 65 mA or less, which provides high reliability during operation in a high temperature environment at 70° C., it is desirable that the refractive index difference between these layers is 0.02 or less, as can be seen from the relation shown in FIG. 6B.

Figure 7:
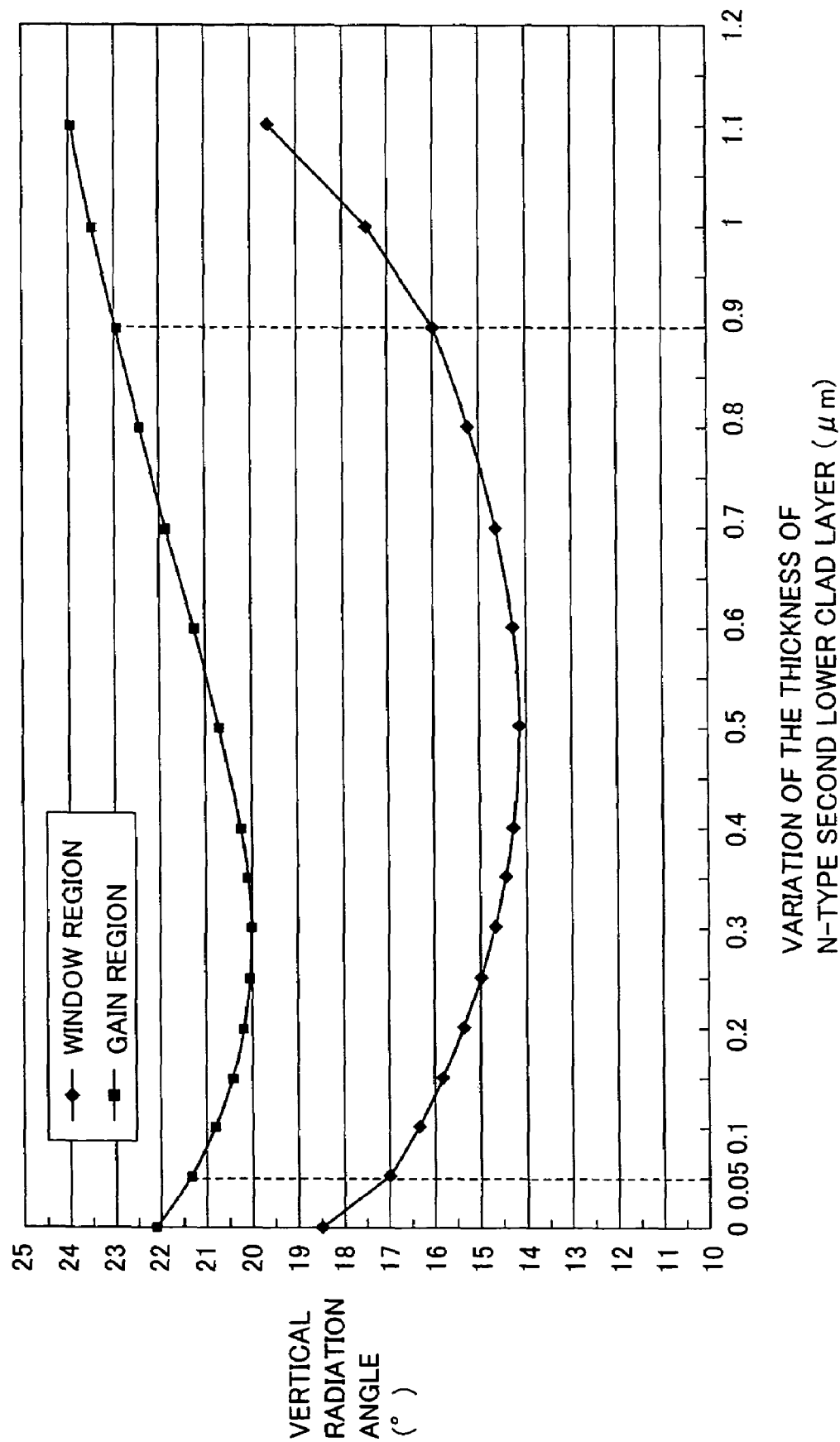
FIG. 7 shows the relation between the variation in the thickness of the n-type second lower clad layer and the vertical radiation angle of emitted laser light.

FIG. 7 shows the relation between the variation in the thickness of n-type second lower clad layer 104 and the vertical radiation angle of emitted laser light (the line described as "window region" represents the vertical radiation angle of actually emitted laser light according to the present embodiment). As can be seen in FIG. 7, the vertical radiation angle of emitted laser light tends to decrease at first and then increase with increasing thickness of n-type second lower clad layer 104. In order to make the vertical radiation angle of emitted laser light to 17° or less, which is suitable for optical disks, it is desirable that the thickness of n-type second lower clad layer 104 is in the range from 0.05 μm or more to 0.9 μm or less. Within this range of the thickness of n-type second lower clad layer 104, the threshold current is in the range from 40 to 41 mA and thus is hardly changed. Further, in FIG. 7, the vertical radiation angle in the gain region, which is shown for comparison, was obtained from measurements for a separately fabricated semiconductor laser. This semiconductor laser was fabricated by removing window regions from a semiconductor laser having the same configuration as that of the present embodiment to expose the gain region thereof at the end faces from which the window regions are removed. As can be seen from FIG. 7, in the case window regions are formed, the vertical radiation angle of emitted laser light is reduced, as compared with the case where window regions are not formed.

Figure 8:
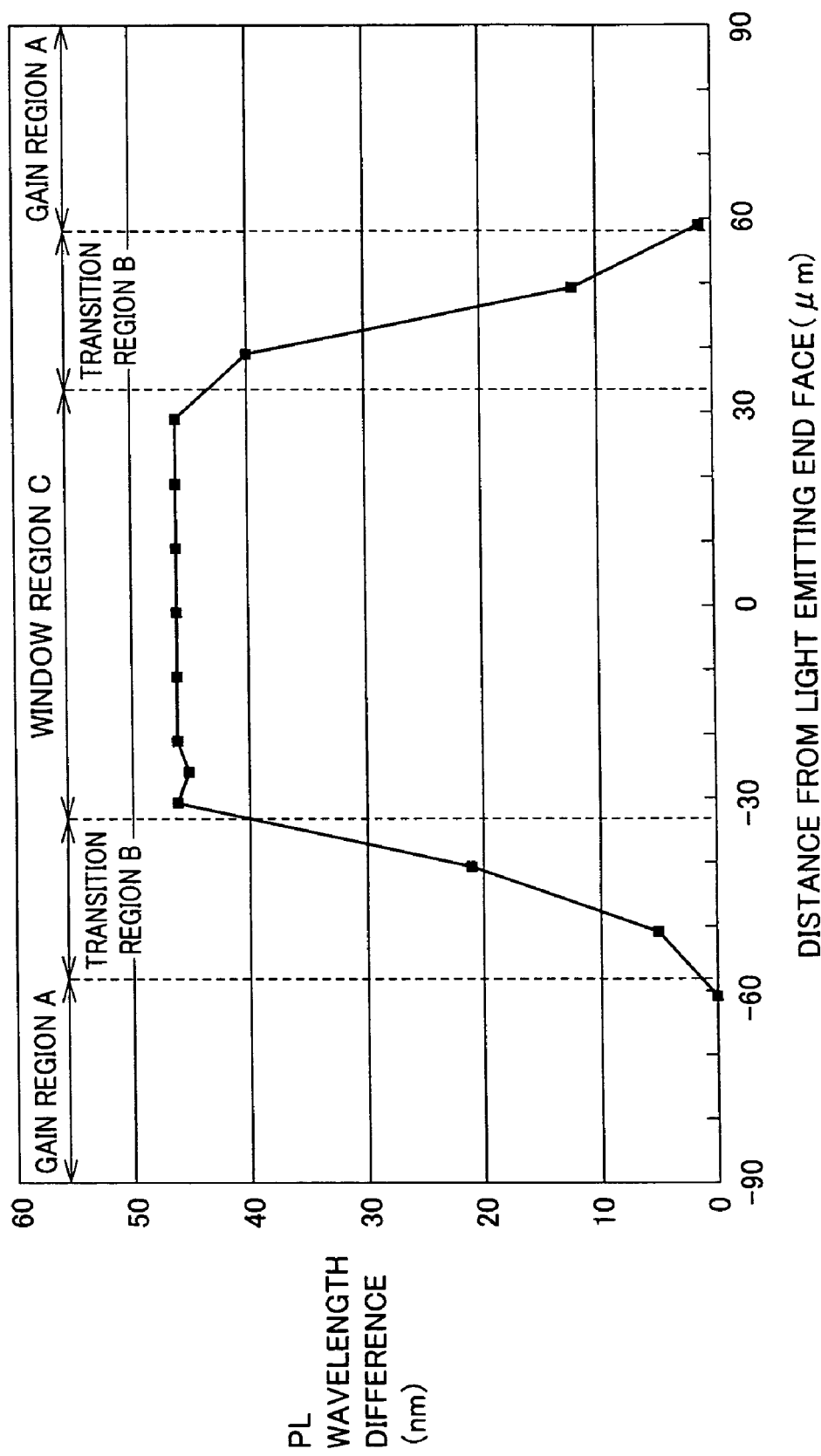
FIG. 8 shows the relation between the distance from a light emitting end face and the PL wavelength difference between the PL wavelength in the active layer within the gain region and the PL wavelength in the active layers in the window regions in the semiconductor laser according to the present invention.

FIG. 8 shows the relation between the distance from a light emitting end face and the PL wavelength difference between the PL wavelength in the active layer within gain region A and the PL wavelength in the active layers in window regions C. Namely, the semiconductor laser is to be cleaved at the point of 0 μm on the horizontal axis of FIG. 8 and the cleavage plane will become a light emitting end face of the semiconductor laser. In FIG. 8, the PL wavelength difference is substantially constant within window regions C, but the PL wavelength difference gradually decreases in transition regions B over about 25 μm. Here, the width of transition regions B is defined as a width which decreases the PL wavelength difference between the PL wavelength in the active layer in gain region A and the PL wavelength in the active layers in window regions C from 10% to 90% of a maximum value of the PL wavelength difference.

Figure 9:
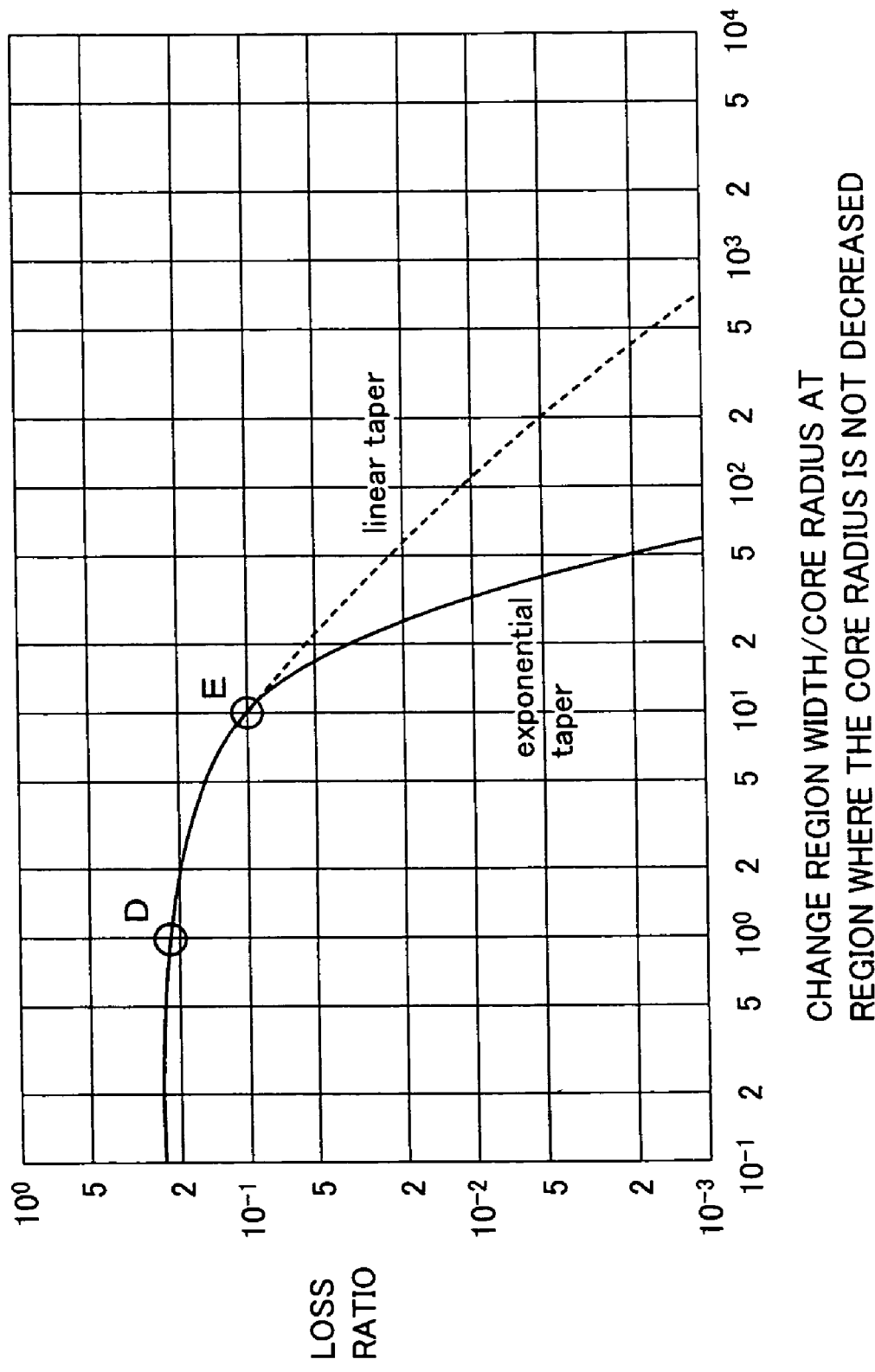
FIG. 9 is a diagram quoted from a literature (D. Marcuse, B.S.T.J. vol. 49, No. 8 October, 1970)

FIG. 9 is a diagram quoted from a literature concerning tapered optical fibers having a core radius which is gradually decreased to half (D. Marcuse, B.S.T.J. vol. 49, No. 8 October 1970), for describing a preferable transition region width for the semiconductor laser according to the present invention. In FIG. 9, the horizontal axis represents the ratio of the width of the change region (the region where the core radius gradually decreases) to the core radius of the region where the core radius is not decreased (i.e. the change region width/the core radius of the region where the core radius is not decreased). The vertical axis represents the light loss ratio associated with mode conversion. The solid line in FIG. 9 represents such a ratio in the case there is a smooth, exponentially tapered interface between the change region and the normal region (the region where the core radius is not decreased). The broken line in FIG. 9 represents such a ratio in the case there is an angulated, linear tapered interface between the change region and the normal region.

As shown in FIG. 9, when the change region width is equal to or less than the core radius of the region where the core radius is not decreased, the light loss ratio exceeds 20% (namely, it lies in the region in the left of the point D in FIG. 9). When the change region width is equal to or more than 10 times the core radius of the region where the core radius is not decreased, the light loss ratio is reduced to 10% or less (namely, it lies in the region in the right of the point E in FIG. 9).

In the aforementioned literature, the refractive index of the core is 1.432 and the refractive index of the clad is 1. Thus, there is a large refractive index difference between the core and the clad, and therefore it is deemed that light is substantially confined within the core. Consequently, the core radius of the region where the core radius is not decreased in the aforementioned literature is deemed to be corresponding to the distance from the center of the thickness of active layer 105 to the upper surface of p-type second upper clad layer 108 (about 1.6 μm) of the semiconductor laser of the present invention shown in FIG. 2.

Consequently, in view of reduction in the light loss, when the transition region width of the semiconductor laser of the present invention is set to a value equal to or more than 10 times the distance from the center of the thickness of active layer 105 to the upper surface of p-type second clad layer 108 (about 1.6 μm), namely 16 μm or more, reduction of the light loss ratio may be expected even if the distance from the center of the thickness of active layer 105 to the upper surface of p-type second clad layer 108 decreases gradually toward light emitting end face 124 and becomes half at light emitting end face 124.

The transition region width may be changed by changing the thickness of p-type GaAs cap layer 110. In order to set the transition region width to 16 μm or more, it is desirable to set the thickness of p-type GaAs cap layer 110 to 0.05 μm or more.

Figure 10A:
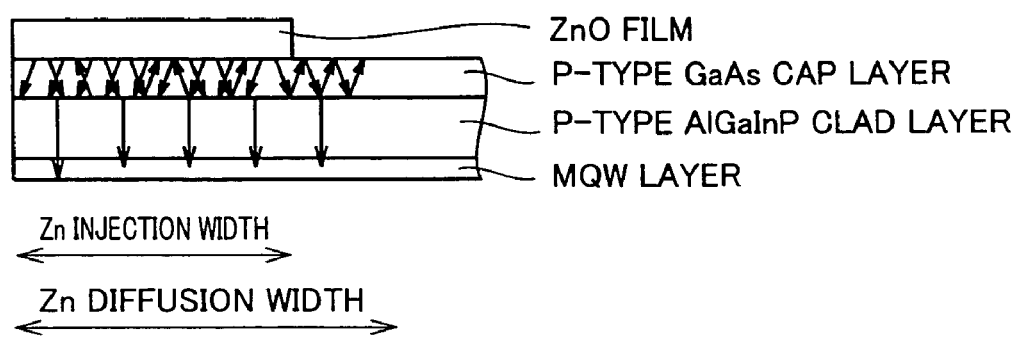
FIG. 10A is a schematic diagram for describing the formation of the window regions by IILD.

FIG. 10A is a diagram for describing the formation of the window regions by IILD. For ease of description, the description will be given with respect to a device consisting of three layers of a MQW layer, a Be-doped p-type AlGaInP clad layer with a thickness of 1.5 μm and a Be-doped p-type GaAs cap layer with a thickness of 0.5 μm, which are sequentially deposited in this order.

In FIG. 10A, by applying a thermal process with a ZnO film formed on the upper surface of the p-type GaAs cap layer, Zn from the ZnO film is injected into the p-type GaAs cap layer and is diff-used into the device, generating interstitial atoms such as Zn within the device (Ga is replaced with Zn, generating interstitial Ga atoms, and also Be is replaced with Zn, generating interstitial Be atoms). These atoms have a property of preferring staying at the p-type GaAs cap layer having a valence band energy higher than that of the p-type AlGaInP clad layer, and therefore these atoms are reflected at the interface between the p-type GaAs cap layer and the p-type AlGaInP clad layer during diffusion (Reference Literature; P.N. Grillot el. al., Acceptor diffusion and segregation in $(Al_xGa_{1-x})_{0.5}In_{0.5}P$ heterostructures, Journal of Applied Physics, Volume 91, Number 8, pp. 4891-4899, 2002). Therefore, even when the distance from the bottom surface of the ZnO film to the MQW layer is about 2 μm, Zn and the like will gradually diffuse by a distance sufficiently longer than 2 μm, for example about 25 μm in the width-wise direction of the device. Consequently, transition regions may be easily formed between the window regions and the gain region.

Figure 10B:
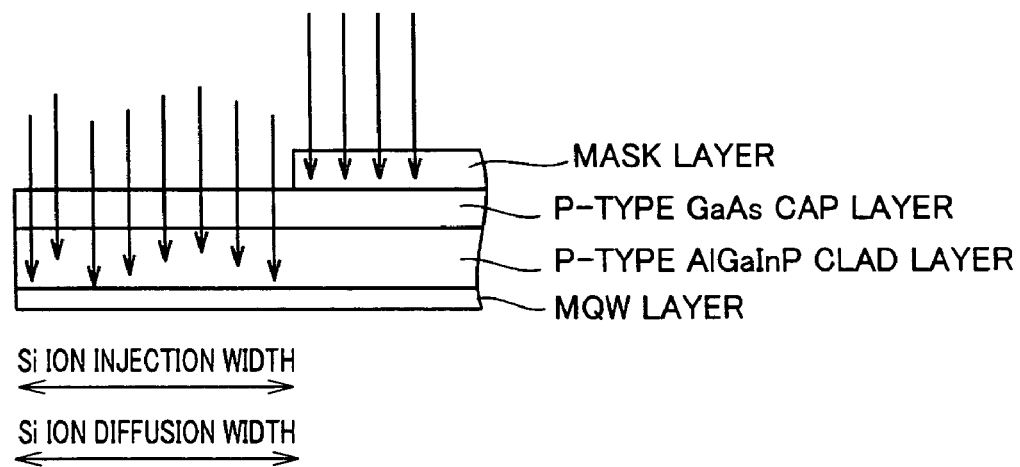
FIG. 10B is a schematic diagram for describing the formation of the window regions by Si ion implantation.

FIG. 10B is a schematic diagram for describing the formation of window regions by Si ion implantation. In this case, a mask layer is utilized only for shielding the Si ion implantation and there is no specific mechanism for facilitating diffusion in the width-wise direction of the device, resulting in a steep interface between the window regions and the gain region. Consequently, in this case, transition regions may not be easily formed between the window regions and the gain region.

A typical semiconductor laser according to the present invention has a lasing wavelength of 656 nm, a threshold current of 38 mA, a characteristic temperature of 110 K and a differential quantum efficiency of 1.1 W/A and are capable of generating light output of 140 mW (duty: 50%) at 70° C. and operating for 3000 hours or more. This semiconductor laser has a vertical radiation angle of 15°, a horizontal radiation angle of 12° and an elliptical ratio of 1.25, which is the ratio of the vertical radiation angle to the horizontal radiation angle. Accordingly, in using for optical disks, the semiconductor laser may provide a near-complete round light spot without shaping the laser light.

For comparison, for a semiconductor laser having the same configuration as the semiconductor laser according to the present invention except that no window region is formed, measurements of the vertical radiation angle, the horizontal radiation angle and the elliptical ratio were performed. The measurements showed that this semiconductor laser had a vertical radiation angle of 21°, a horizontal radiation angle of 12° and an elliptical ratio of 1.75.

Consequently, according to the present invention, the elliptical ratio may be improved from 1.75 to 1.25 without changing the amount of light confined within the active layer. Furthermore, since the amount of light confined within the active layer is not changed, a favorable characteristic temperature as described above may be achieved.

Second Embodiment

Figure 11:
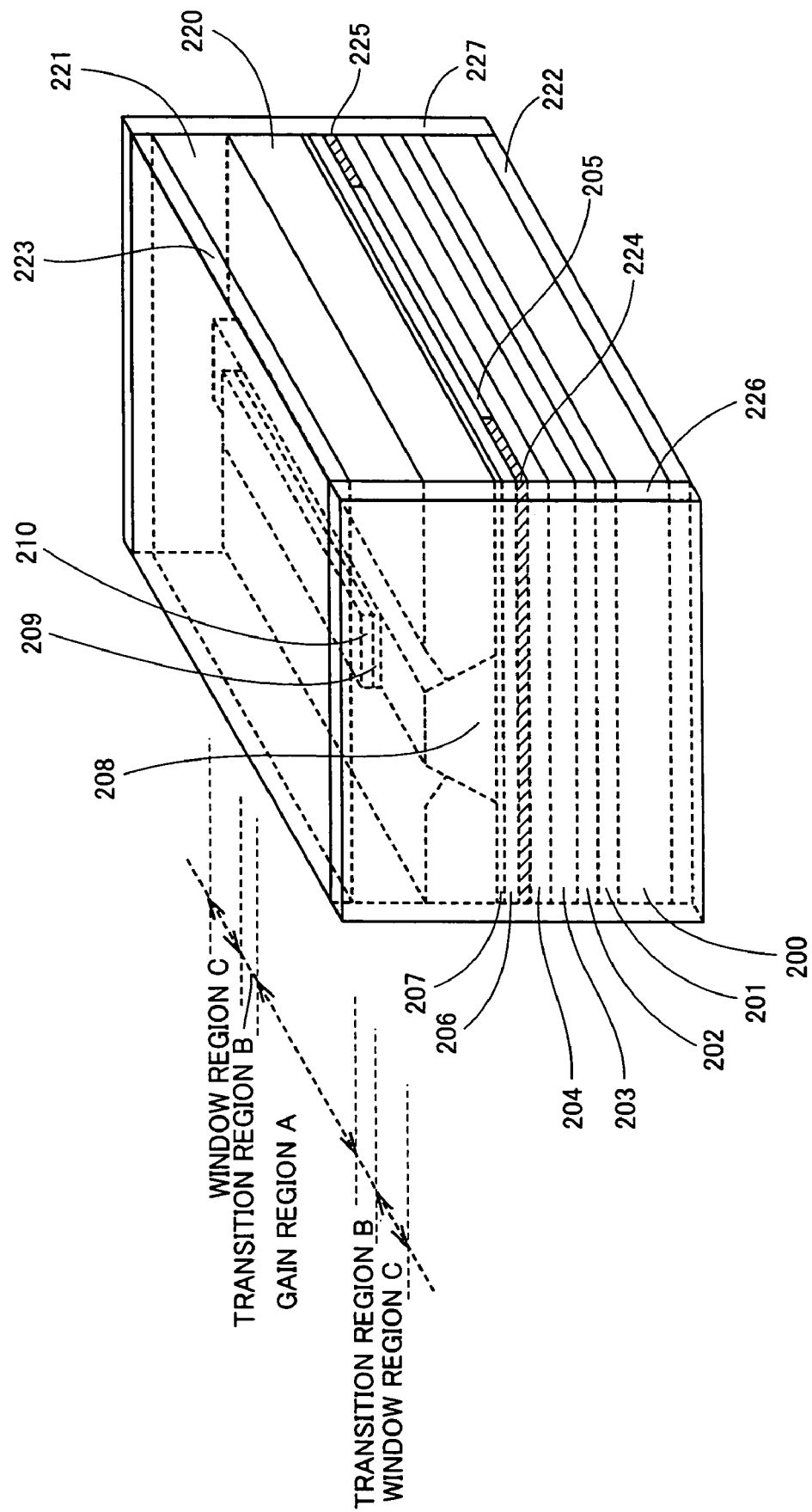
FIG. 11 is a schematic perspective view of a semiconductor laser according to another preferable embodiment of the present invention.

FIG. 11 is a schematic perspective view of a semiconductor laser according to another preferable embodiment of the present invention. As shown in FIG. 11, this semiconductor laser includes an n-type GaAs buffer layer 201, an n-type GaInP buffer layer 202, an n-type $(Al_{0.65}Ga_{0.35})_{0.5}In_{0.5}P$ first lower clad layer 203 (thickness: 2.0 μm), an n-type $(Al_{0.68}Ga_{0.32})_{0.5}In_{0.5}P$ second lower clad layer 204 (thickness: 0.2 μm), an undoped-active layer 205 including quantum well layers, a p-type $(Al_{0.68}Ga_{0.32})_{0.5}In_{0.5}P$ first upper clad layer 206 (thickness: 0.1 μm), and a p-type GaInP etching stop layer 207, which are sequentially formed on an n-type GaAs substrate 200.

Furthermore, as a ridge stripe portion, there is formed a p-type $(Al_{0.68}Ga_{0.32})_{0.5}In_{0.5}P$ second upper clad layer 208 (thickness: 1.5 μm) protruded upwardly from a portion of the surface of p-type etching stop layer 207. A p-type GaInP intermediate band gap layer 209 (thickness: 0.05 μm) and a p-type GaAs cap layer 210 (thickness: 0.5 μm) are sequentially formed on p-type second upper clad layer 208.

Furthermore, on the region of p-type GaInP etching stop layer 207 onto which p-type second upper clad layer 208 is not formed, an n-type AlInP current stop layer 220 is formed. A p-type GaAs contact layer 221 and a p-side electrode 223 are sequentially formed on p-type second upper clad layer 208, n-type current stop layer 220 and p-type GaAs cap layer 210. Furthermore, on the surface of n-type substrate 200 opposite to the side onto which the aforementioned semiconductor layers are deposited, an n-side electrode 222 is formed.

Furthermore, at light emitting end faces 224, 225, a front face reflective film 226 and a rear face reflective film 227 are formed, respectively.

This semiconductor laser is characterized in that n-type first lower clad layer 203 has a Al content lower than that of n-type second lower clad layer 204 and n-type second lower clad layer 204 has a Al content equal to that of p-type first upper clad layer 206, and therefore, n-type first lower clad layer 203 has a refractive index greater than those of n-type second lower clad layer 204 and p-type first upper clad layer 206 and n-type second lower clad layer 204 has a refractive index equal to that of p-type first upper clad layer 206.

With this semiconductor laser, similarly, the light intensity distribution in the window regions C may be spread more widely toward n-type substrate 200 than the light intensity distribution in the gain region without decreasing the amount of light confined within the active layer. Therefore, the elliptical ratio of emitted laser light may be reduced without degrading the threshold current and the characteristic temperature.

Others

In the above embodiment, layers having low refractive indexes may be formed between the n-type first lower clad layer and the GaInP buffer layer and between the p-type second upper clad layer and the p-type GaInP intermediate band gap layer to further reduce the light loss.

Further, while the active layer includes a plurality of quantum well layers in the above embodiment, the active layer may include only a single quantum layer.

Further, while the mixed-crystallization ratio of the guide layers and the mixed-crystallization ratio of the barrier layers are equalized in the above embodiment, the mixed-crystallization ratios of the guide layers and barrier layers may be different.

Further, in the above embodiment, Mg or Zn, as well as Be, may be employed as a P-type dopant. In the case of using Mg or Zn as a P-type dopant, it is desirable to deposit semiconductor layers by a MOCVD method.

Further, in the above embodiment, n-type layers such as the n-type current stop layer may be formed on the ridge stripe portion placed above the window regions to prevent current injection into the window regions.

Further, in the above embodiment, a dielectric film, such as a silicon oxide film or a silicon nitride film, may be formed instead of the n-type current stop layer in order to simplify the configuration of the semiconductor laser.

Further, in the above embodiment, for example, an atomic vacancy diffusion method may be also utilized as the window region forming method.

Further, while in the above embodiment the lower clad layers, the active layer and the upper clad layers are formed from semiconductor layers represented by general formula AlGaInP or GaInP, these layers may be formed from semiconductor layers represented by the general formula AlGaAs or GaAs.

According to the present invention, there are provided a semiconductor laser capable of emitting laser light with a low elliptical ratio even in high temperature operation environments, and a method for fabricating such a semiconductor laser. Accordingly, an optical disk pick up with a simple configuration may be employed without degrading the efficiency of laser light utilization, which contributes to reduction in the size and weight of an optical pick up, or high-speed access.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser comprising
a lower clad layer,
a multiple quantum well (MQW) configuration,
guide layers adjacent to said MQW configuration, and
an upper clad layer formed above a semiconductor substrate,
said semiconductor laser having a window region including a portion in which said MQW configuration and said guide layers are intermixed in the vicinity of a light emitting end face perpendicular to the surface of said semiconductor substrate, wherein
said lower clad layer has a refractive index higher than that of said upper clad layer, and
said MQW configuration and said guide layers are intermixed so that the light intensity distribution in said window region spreads more widely in the direction perpendicular to the surface of said semiconductor substrate than the light intensity distribution in a gain region of said semiconductor laser.

2. A semiconductor laser comprising
a lower clad layer,
a multiple quantum well (MQW) configuration,
guide layers adjacent to said MQW configuration, and
an upper clad layer formed above a semiconductor substrate,
said semiconductor laser having a window region including a portion in which said MQW configuration and said guide layers are intermixed in the vicinity of a light emitting end face perpendicular to the surface of said semiconductor substrate, wherein
said lower clad layer includes a layer having a refractive index higher than that of said upper clad layer, and
said MQW configuration and said guide layers are intermixed so that the light intensity distribution in said window region spreads more widely in the direction perpendicular to the surface of said semiconductor substrate than the light intensity distribution in a gain region of said semiconductor laser.

3. The semiconductor laser according to claim 2, wherein
said window region, a transition region where the spread of the light intensity distribution varies and said gain region are arranged in this order from said light emitting end face, and
the photoluminescence wavelength in said MQW configuration and said guide layers within said window region is shorter than the photoluminescence wavelength in said MQW configuration and said guide layers within said gain region by 15 nm or more.

4. The semiconductor laser according to claim 2, wherein
said window region, a transition region where the spread of the light intensity distribution varies and said gain region are arranged in this order from said light emitting end face, and
the photoluminescence wavelength in said MQW configuration and said guide layers within said window region is shorter than the photoluminescence wavelength in said MQW configuration and said guide layers within said gain region by 40 nm or more.

5. The semiconductor laser according to claim 2, wherein
said window region, a transition region where the spread of the light intensity distribution varies and said gain region are arranged in this order from said light emitting end face, and
said transition region has a width of 16 μm or more in the direction perpendicular to said light emitting end face.

6. The semiconductor laser according to claim 2, further comprising:
a cap layer having a valence band energy higher than that of said upper clad layer, above said upper clad layer, wherein
said layer intermixing is achieved by injecting impurity from a portion above said cap layer and causing the impurity to diffuse.

7. The semiconductor laser according to claim 2, wherein
said lower clad layer, said MQW configuration, said guide layers, and said upper clad layer are formed from semiconductor layers represented by the general formula: $(Al_xGa_{1-x})_yIn_{1-y}P$ (where $0 \leq x \leq 1$ and $0 \leq y \leq 1$) or $Ga_zIn_{1-z}P$ (where $0 \leq z \leq 1$).

8. The semiconductor laser according to claim 2, wherein
said lower clad layer, said MQW configuration, said guide layers, and said upper clad layer are formed from semiconductor layers represented by the general formula: $Al_rGa_{1-r}As$ (where $0 \leq r \leq 1$) or GaAs.

9. A semiconductor laser comprising
a lower clad layer,
an active layer including at least one quantum well layer, and
an upper clad layer formed in this order above a semiconductor substrate,
said semiconductor laser having a window region including a portion in which the quantum well layer in said active layer and layers adjacent to said active layer are intermixed in the vicinity of a light emitting end face perpendicular to the surface of said semiconductor substrate, wherein
said lower clad layer includes a layer having a refractive index higher than that of said upper clad layer, and
the light intensity distribution in said window region spreads more widely in the direction perpendicular to the surface of said semiconductor substrate than the light intensity distribution in a gain region of said semiconductor laser, said lower clad layer includes a first lower clad layer closer to said semiconductor substrate and a second lower clad layer closer to said active layer, and said first lower clad layer has a refractive index higher than that of said second lower clad layer.

10. The semiconductor laser according to claim 9, wherein said first lower clad layer has a refractive index higher than that of said second lower clad layer by 0.003 or more to 0.02 or less.

11. The semiconductor laser according to claim 9, wherein said second lower clad layer has a thickness of 0.05 μm or more to 0.9 μm or less.

* * * * *